United States Patent [19]
Tukidate

[11] Patent Number: 5,646,565
[45] Date of Patent: Jul. 8, 1997

[54] PULSE-WIDTH-EXTENSION CIRCUIT AND ELECTRONIC DEVICE INCLUDING THE CIRCUIT

[75] Inventor: Yoshihiro Tukidate, Kawasaki, Japan

[73] Assignee: Fujitsu Limited, Kawasaki, Japan

[21] Appl. No.: 490,082

[22] Filed: Jun. 13, 1995

[30] Foreign Application Priority Data

Jul. 18, 1994 [JP] Japan .................. 6-164960

[51] Int. Cl.$^6$ .................. G11C 13/00; H03K 5/13
[52] U.S. Cl. .................. 327/174; 327/172; 327/176; 327/26; 327/34; 327/37; 327/18; 365/233.5
[58] Field of Search .................. 327/170, 172, 327/174, 261, 263, 173, 175, 176, 200, 199, 31, 36, 37, 38, 18, 19, 20, 21, 34, 26; 365/233.5

[56] References Cited

U.S. PATENT DOCUMENTS 3,958,182  5/1976  Sauthier .................. 327/176
5,438,303  8/1995  Murakami et al. .................. 327/122

OTHER PUBLICATIONS

"IBM Technical Disclosure Bulletin", Boden, vol. 14, No. 9, Feb. 1972, p. 2651.

Primary Examiner—Timothy P. Callahan
Assistant Examiner—Dinh T. Le
Attorney, Agent, or Firm—Armstrong, Westerman Hattori, McLeland & Naughton

[57]  ABSTRACT

A pulse-width-extension circuit for producing an output pulse signal whose pulse width is extended as compared with a pulse width of an input pulse signal when the pulse width of the input pulse signal is equal to or longer than a given width. The pulse-width-extension circuit produces no output pulse signal when the pulse width of the input pulse signal is shorter than the given width.

13 Claims, 14 Drawing Sheets

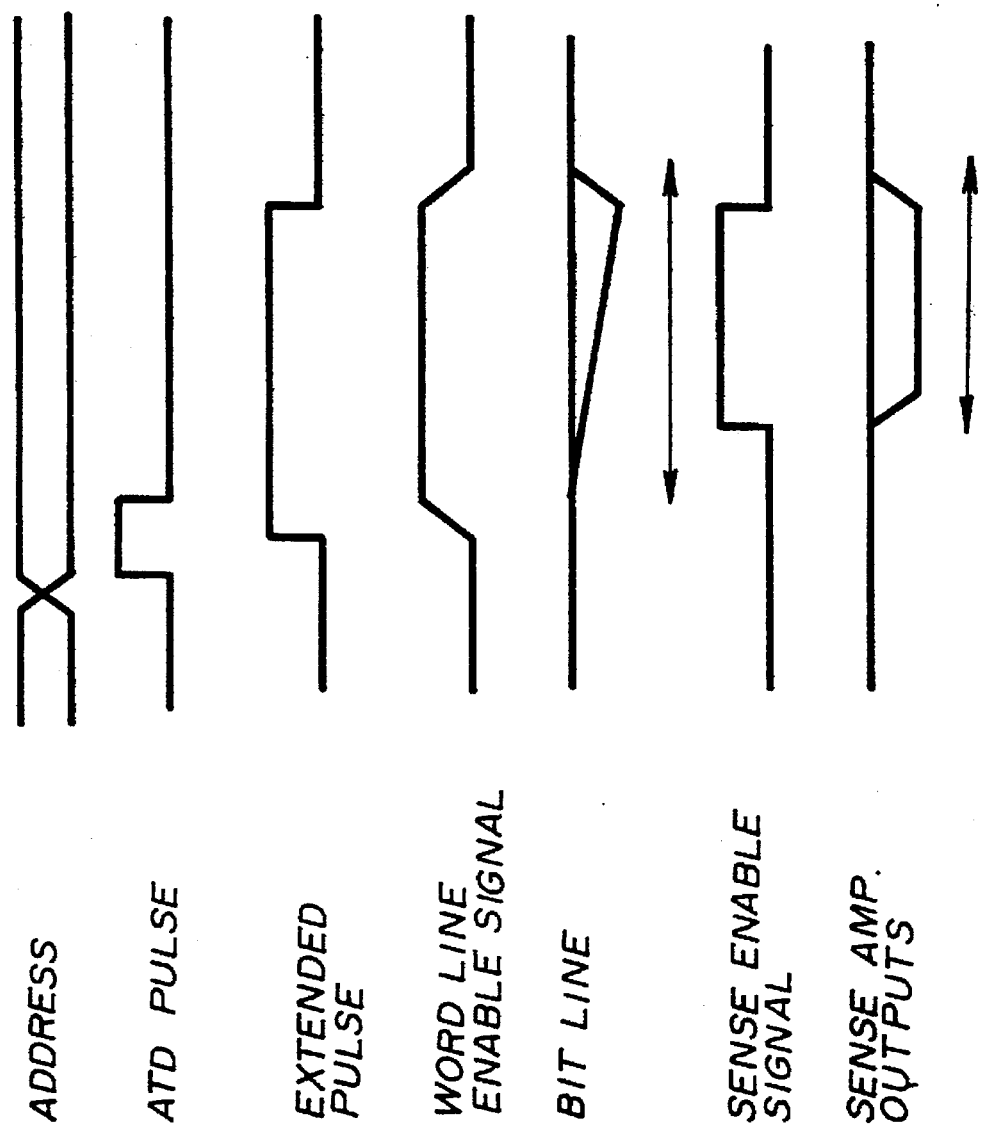

PULSE-WIDTH-EXTENSION CIRCUIT AND ELECTRONIC DEVICE INCLUDING THE CIRCUIT

BACKGROUND OF THE INVENTION

1. Field of the Invention

The present invention generally relates to a pulse-width-extension circuit and an electronic device including the circuit, and more particularly, to a pulse-width-extension circuit which extends a pulse width of an input pulse signal and to an electronic device such as a memory circuit including the pulse-width-extension circuit.

2. Description of the Related Art

A pulse-width-extension circuit is used in electronic circuits such as memories. More specifically, some static random access memories (SRAMs) have the pulse-width-extension circuit connected with an address-transition detection circuit (ATD circuit). In the SRAM, the ATD circuit detects a transition of an address signal supplied to the memory and produces an address-transition detection signal (ATD signal). The pulse-width-extension circuit extends a pulse width of the ATD signal. The ATD signal whose pulse width has been extended is supplied to, for example, a sense amplifier as a sense-amplifier activating signal. The ATD signal whose pulse width has been extended is also supplied to bit lines in a memory-cell array to rapidly change bit-line signals.

FIG. 1 shows a schematic diagram of a conventional pulse-width-extension circuit for the memory circuit. This pulse-width-extension circuit comprises a delay circuit 2 and a NOR circuit 18. The ATD signal from the ATD circuit is applied to an ATD-signal input port 1. In the delay circuit 2, the ATD signal is delayed such that a delay time of a trailing edge of the ATD signal is longer than that of a leading edge thereof.

The delay circuit 2 comprises serially connected inverters 3 to 8, in which input threshold voltages of the inverters 3, 5, 7 are respectively set to relatively low voltages, and input threshold voltages of inverters 4, 6, 8 are respectively set to relatively high voltages.

Power-source voltage VCC is supplied to power source lines 9, 10, 11. Power-source voltage input ports of the inverters 3, 5, 7 are respectively connected to the power-source lines 9, 10, 11 through resistances 12, 13, 14. Power-source voltage input ports of the inverters 4, 6, 8 are directly connected to a power-source line (not shown). Capacitors 15, 16, 17 are connected between each output of the inverters 3, 5, 7 and a ground.

A rise time of an output signal of the inverter 3 is set to a relatively long time by an RC delay circuit consisting of the resistance 12 and the capacitor 15. A rise time of an output signal of the inverter 5 is set to a relatively long time by an RC delay circuit consisting of the resistance 13 and the capacitor 16. A rise time of an output signal of the inverter 7 is set to a relatively long time by an RC delay circuit consisting of the resistance 14 and the capacitor 17.

An output of the delay circuit 2 and the ATD signal applied to the ATD-signal input port 1 are supplied to the NOR circuit 18 to produce the sense-amplifier activating signal SE.

FIG. 2 shows a timing diagram indicating an operation of the conventional pulse-width-extension circuit shown in FIG. 1 in a case that the ATD signal having a normal pulse width is produced from the ATD circuit based on the transition of the address signal. Part "A" of FIG. 2 is indicated in "FIG. 2-(A)", such representation is used in the following FIGS. 3, 6, and 7. FIG. 2-(A) indicates the ATD signal, FIG. 2-(B) indicates an output S3 of the inverter 3, FIG. 2-(C) indicates an output S4 of the inverter 4, FIG. 2-(D) indicates an output S5 of the inverter 5, FIG. 2-(E) indicates an output S6 of the inverter 6, FIG. 2-(F) indicates an output S7 of the inverter 7, FIG. 2-(G) indicates an output S8 of the inverter 8, and FIG. 2-(H) indicates the sense-amplifier activating signal SE.

In the pulse-width-extension circuit shown in FIG. 1, when no ATD signal (pulse) is produced from the ATD circuit, a level of the ATD-signal input port 1 is kept at a low level (L level). In this situation, the output S3 of the inverter 3 is at a high level (H level), the output level S4 of the inverter 4 is at the L level, the output level S5 of the inverter 5 is at the H level, the output level S6 of the inverter 6 is at the L level, the output level S7 of the inverter 7 is at the H level, the output level S8 of the inverter 8 is at the L level, and the sense-amplifier activating signal SE is at the H level (deactivation level).

Then, when the ATD signal is produced from the ATD circuit (a pulse of the ATD signal rises up), the level of the ATD-signal input port 1 becomes the H level. In this situation, the output S3 of the inverter 3 becomes the L level, the output level S4 of the inverter 4 becomes the H level, the output level S5 of the inverter 5 becomes the L level, the output level S6 of the inverter 6 becomes the H level, the output level S7 of the inverter 7 becomes the L level, the output level S8 of the inverter 8 becomes the H level, and the sense-amplifier activating signal SE becomes the L level (activation level).

As mentioned before, the input threshold voltages of the inverters 3, 5, 7 are respectively set to the relatively low voltages, and the input threshold voltages of the inverters 4, 6, 8 are respectively set to the relatively high voltages, a transition from the L level to the H level in a leading edge of the output S8 of the inverter 8 is carried out in a relatively short time after the ATD signal rises.

Then, when the level of the ATD signal falls, the level of the ATD-signal input port 1 becomes the L level. In this situation, the output S3 of the inverter 3 becomes the H level, the output level S4 of the inverter 4 becomes the L level, the output level S5 of the inverter 5 becomes the H level, the output level S6 of the inverter 6 becomes the L level, the output level S7 of the inverter 7 becomes the H level, the output level S8 of the inverter 8 becomes the L level, and the sense-amplifier activating signal SE returns to the H level (deactivation level).

Since the rise times of the output signals of the inverters 3, 5, 7 are respectively set to relatively long times, and the input threshold voltages of the inverters 4, 6, 8 are respectively set to relatively high voltages, a transition from the H level to the L level in a trailing edge of the output S8 of the inverter 8 is carried out a relatively long time after the level of the ATD signal falls.

In this way, in the pulse-width-extension circuit shown in FIG. 1, the pulse width of the ATD signal from the ATD circuit is extended, and the ATD signal having such an extended pulse width is produced as the sense-amplifier activating signal SE.

However, the conventional pulse-width-extension circuit has suffers from the following drawback:

FIG. 3 shows a timing diagram indicating an operation of the conventional pulse-width-extension circuit shown in FIG. 1 in a case that an abnormal ATD signal which has a short pulse width due to noise, etc., is produced from the ATD circuit. FIG. 3-(A) indicates the ATD signal having the abnormal short pulse width, FIG. 3-(B) indicates the output S3 of the inverter 3, FIG. 3-(C) indicates the output S4 of the inverter 4, FIG. 3-(D) indicates the output S5 of the inverter 5, FIG. 3-(E) indicates the output S6 of the inverter 6, FIG. 3-(F) indicates the output S7 of the inverter 7, FIG. 3-(G) indicates the output S8 of the inverter 8, FIG. 3-(H) indicates the sense-amplifier activating signal SE.

As shown in FIG. 3, in the conventional pulse-width-extension circuit shown in FIG. 1, if the abnormal ATD signal which has a short pulse width due to the noise, etc., is produced from the ATD circuit, the pulse width of the ATD signal is not extended to a required width. Therefore, the sense-amplifier activating signal SE may not have pulse width of sufficient duration to exactly activate the sense amplifier. There is thus a problem that this signal causes a fault operation in the sense amplifier.

SUMMARY OF THE INVENTION

It is an object of this invention to provide a pulse-width-extension circuit. In this circuit, when a pulse width of an input pulse signal is shorter than a given width, the circuit produces no output pulse signal to prevent a fault operation of the following circuit. When the pulse width of the input signal is equal to or longer than the given width, the circuit produces the output pulse signal whose pulse width is extended as compared to that of the input pulse signal. This permits the disadvantages described above to be eliminated.

The object described above is achieved by a pulse-width-extension circuit comprising: a circuit for producing an output pulse signal whose pulse width is extended as compared with a pulse width of an input pulse signal when the pulse width of the input pulse signal satisfies a given condition. The given condition is that the pulse width of the input pulse signal is equal to or longer than a given width. And the circuit produces no output pulse signal when the pulse width of the input pulse signal is shorter than the given width.

The object described above is also achieved by the pulse-width-extension circuit mentioned above, wherein the circuit comprises: a delay circuit delaying the input pulse signal such that a delay time of a trailing edge of the input pulse signal is longer than that of a leading edge thereof; a pulse-width detection circuit detecting the pulse width of the input pulse signal, and producing a pulse-width detection signal when the pulse width of the input pulse signal is equal to or longer than the given width; and an output-pulse-signal generation circuit, when the pulse-width detection signal is supplied, producing the output pulse signal corresponding to the delayed input pulse signal from the delay circuit, and when no pulse-width detection signal is supplied, keeping the same output level.

The object described above is also achieved by the pulse-width-extension circuit mentioned above, wherein the output-pulse-signal generation circuit produces an inverted output level in response to the trailing edge of the delayed input pulse signal from the delay circuit, when the pulse-width detection signal is supplied.

The object described above is also achieved by the pulse-width-extension circuit mentioned above, wherein the delay circuit comprises: a plurality of first inverters, each of the first inverters having a first threshold voltage; and a plurality of second inverters, each of the second inverters having a second threshold voltage higher than the first threshold voltage; wherein the first inverters and the second inverters are alternatively arranged.

The object described above is also achieved by the pulse-width-extension circuit mentioned above, wherein the pulse-width detection circuit is constructed so as to logically process levels of a plurality of points in the delay circuit for detecting the pulse width of the input pulse signal.

The object described above is also achieved by the pulse-width-extension circuit mentioned above, wherein the output-pulse-signal generation circuit is constructed with a flip-flop circuit.

The object described above is also achieved by the pulse-width-extension circuit mentioned above, wherein the flip-flop circuit has a clear port, a clock input port, and an output port, the clear port being supplied with the pulse-width detection signal, the clock input port being supplied the delayed input pulse signal from the delay circuit, and the output port producing the output pulse signal.

The object described above is also achieved by the pulse-width-extension circuit mentioned above, wherein the pulse-width-extension circuit further comprises means for interrupting supply of the pulse-width detection signal to the output-pulse-signal generation circuit when the trailing edge of the input pulse signal is applied to the delay circuit.

The object described above is also achieved by the pulse-width-extension circuit, wherein the input pulse signal is an address-transition detection signal produced from an address-transition detection circuit detecting transition of an address signal, and the output pulse signal is a sense-amplifier activating signal activating a sense amplifier which amplifies data read out from a memory cell.

The object described above is also achieved by an electronic device comprising: a pulse-width-extension circuit for producing an output pulse signal whose pulse width is extended as compared with a pulse width of an input pulse signal when the pulse width of the input pulse signal is equal to or longer than a given width, and for producing no output pulse signal when the pulse width of the input pulse signal is shorter than the given width; a first circuit producing the input pulse signal to the pulse-width-extension circuit; and a second circuit receiving the output pulse signal from the pulse-width-extension circuit.

The object described above is also achieved by the electronic device mentioned above, wherein the pulse-width-extension circuit comprises: a delay circuit delaying the input pulse signal such that a delay time of a trailing edge of the input pulse signal is longer than that of a leading edge thereof; a pulse-width detection circuit detecting the pulse width of the input pulse signal, and producing a pulse-width detection signal when the pulse width of the input pulse signal is equal to or longer than the given width; and an output-pulse-signal generation circuit, when the pulse-width detection signal is supplied, producing the output pulse signal corresponding to the delayed input pulse signal from the delay circuit, and when no pulse-width detection signal is supplied, keeping the same output level.

The object described above is also achieved by the electronic device mentioned above, wherein the output-pulse-signal generation circuit produces an inverted output level in response to the trailing edge of the delayed input pulse signal from the delay circuit, when the pulse-width detection signal is supplied.

The object described above is also achieved by the electronic device mentioned above, wherein the electronic device comprises a memory, the first circuit is an address-transition detection circuit in the memory, and the second circuit is a sense amplifier in the memory.

According to the pulse-width-extension circuit, since the pulse-width detection circuit 21 produces no pulse-width detection signal when the pulse width of the input pulse signal is shorter than the given width, the output-pulse-signal generation circuit 22 generates no output pulse signal whose pulse width may be insufficiently extended.

The present invention may be applied to, for example, the pulse-width-extension circuit in the SRAM. The circuit extends the pulse width of the ATD signal and produces it as the sense-amplifier activating signal. In the pulse-width-extension circuit according to the present invention, even if the abnormal ATD signal which has the short pulse width due to the noise, etc., is produced from the ATD circuit, the fault operation of the sense amplifier due to the abnormal ATD signal may be prevented.

Other objects and further features of the present invention will be apparent from the following detailed description when read in conjunction with the accompanying drawings.

BRIEF DESCRIPTION OF THE DRAWINGS

FIG. 14 is a timing diagram of signals in the SRAM shown in FIG. 13.

DESCRIPTION OF THE PREFERRED EMBODIMENTS

Figure 1:
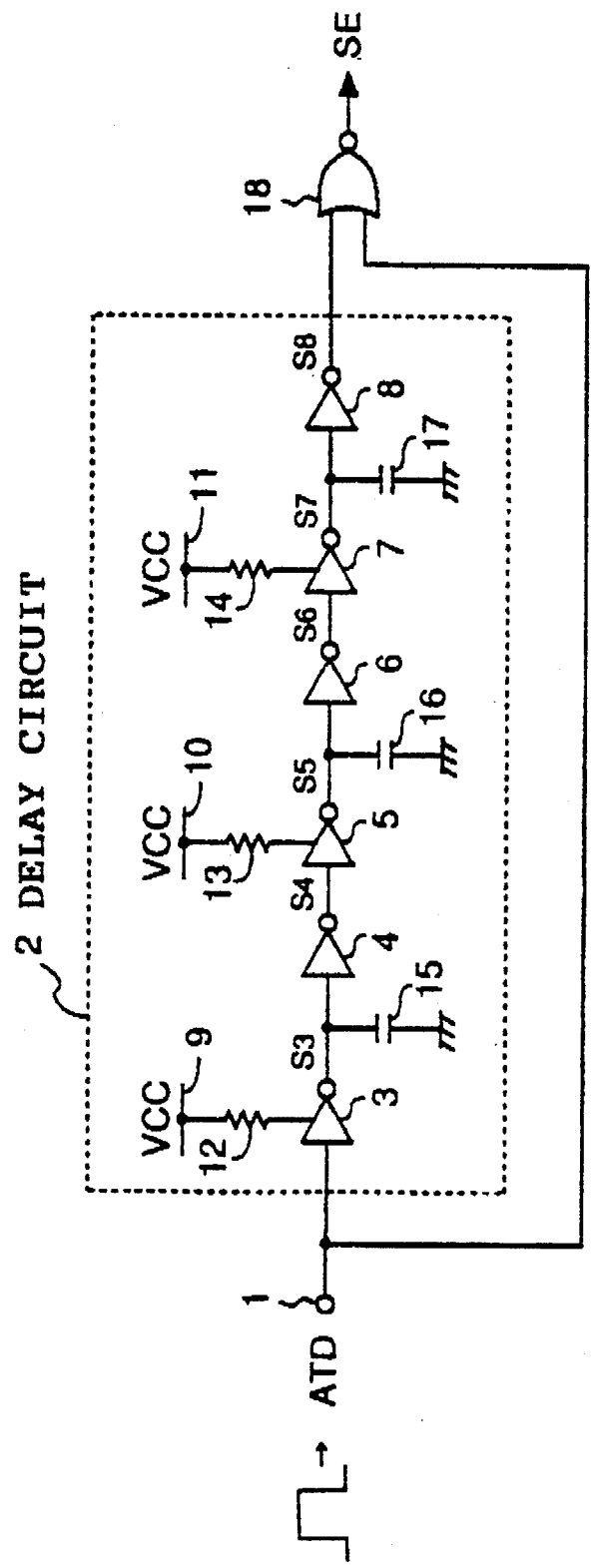
FIG. 1 shows a schematic diagram of a conventional pulse-width-extension circuit for the memory circuit.
Figure 2:
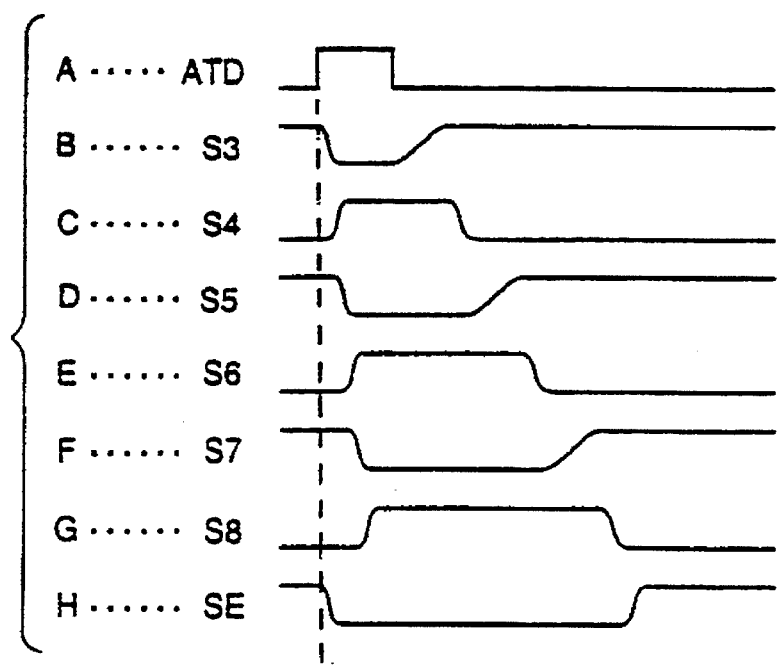
FIG. 2 shows a timing diagram indicating an operation of the conventional pulse-width-extension circuit shown in FIG. 1 in a case that an ATD signal having a normal pulse width is produced from an ATD circuit based on a transition of an address signal.
Figure 3:
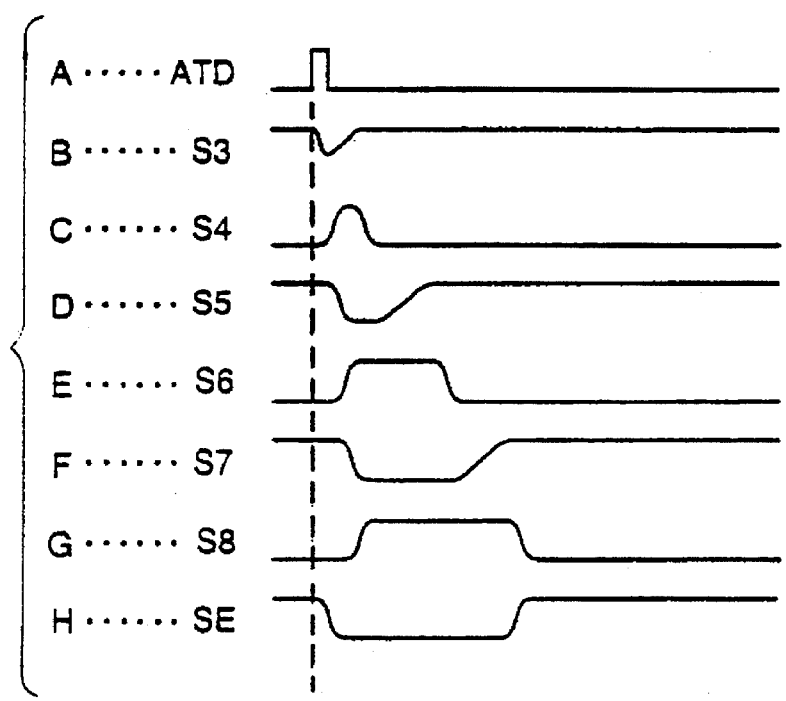
FIG. 3 shows a timing diagram indicating an operation of the conventional pulse-width-extension circuit shown in FIG. 1 in a case that an abnormal ATD signal which has a short pulse width due to noise, etc., is produced from the ATD circuit.

As previously mentioned, in the conventional pulse-width-extension circuit shown in FIG. 1, when the abnormal ATD signal which has a short pulse width due to the noise, etc., is produced from the ATD circuit, the pulse width of the ATD signal is not extended to a required width sufficient to exactly activate the sense amplifier.

As previously noted, in the above situation it is desirable either to produce no ATD signal whose pulse width is not extended to the required width or to produce the ATD signal whose pulse width is sufficiently extended from the short-pulse-width ATD signal.

Figure 4:
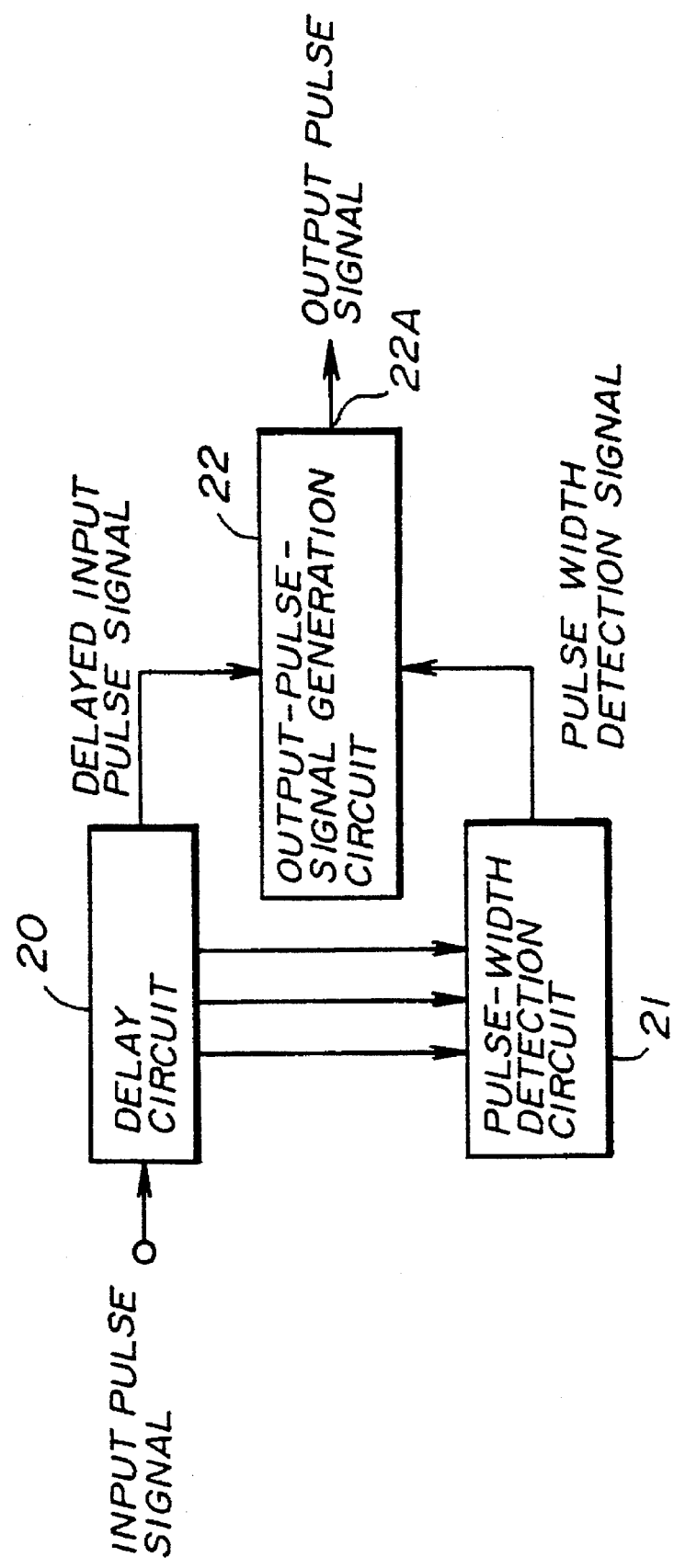
FIG. 4 shows a basic block diagram of a pulse-width-extension circuit according to the present invention.

First, a description will be given of a principle of the pulse-width-extension circuit according to the present invention, by referring to FIG. 4. FIG. 4 shows a basic block diagram of the pulse-width-extension circuit according to the present invention. The pulse-width-extension circuit comprises a delay circuit 20, a pulse-width detection circuit 21, and an output-pulse-signal generation circuit 22.

In the delay circuit 20, an input pulse signal is delayed such that a delay time of a trailing edge of the input pulse signal is longer than that of a leading edge thereof.

In the pulse-width detection circuit 21, the pulse width of the input pulse signal is detected. And only when the pulse width of the input pulse signal is equal to or longer than a given width, a pulse-width detection signal is produced.

The detection of the pulse width of the input pulse signal may be carried out, for example, by logically processing levels of a plurality of points of the delay circuit 20.

The output-pulse-signal generation circuit 22 generates an output pulse signal only when the pulse-width detection signal is supplied. On the other hand, the output-pulse-signal generation circuit 22 maintains the same output level when no pulse-width detection signal is supplied.

In further detail, when the pulse-width detection signal is supplied the output-pulse-signal generation circuit 22 produces an inverted output level and then returns the output level to an initial level in response to the trailing edge of the delayed input pulse signal from the delay circuit 20, and when no pulse-width detection signal is supplied the output-pulse-signal generation circuit 22 maintains the same output level.

According to the present invention, since the pulse-width detection circuit 21 produces no pulse-width detection signal when the pulse width of the input pulse signal is shorter than the given width, the output-pulse-signal generation circuit 22 generates no output pulse signal whose pulse width may be insufficiently extended. Therefore, in the case of applying the pulse-width-extension circuit according to the present invention to an SRAM, even if the abnormal ATD signal which has a short pulse width due to the noise, etc., is produced from the ATD circuit, a fault operation in the following circuit may be prevented.

Next, descriptions will be given of first to third embodiments of the pulse-width-extension circuit according to the present invention, by referring to FIGS. 5 to 9. The following descriptions show a case that the pulse-width-extension circuit according to the present invention is applied to the static random access memory (SRAM), in which the pulse-width-extension circuit extends a pulse width of the ATD signal produced from the ATD circuit and produces the ATD signal as a sense-amplifier activating signal.

1. FIRST EMBODIMENT

Figure 5:
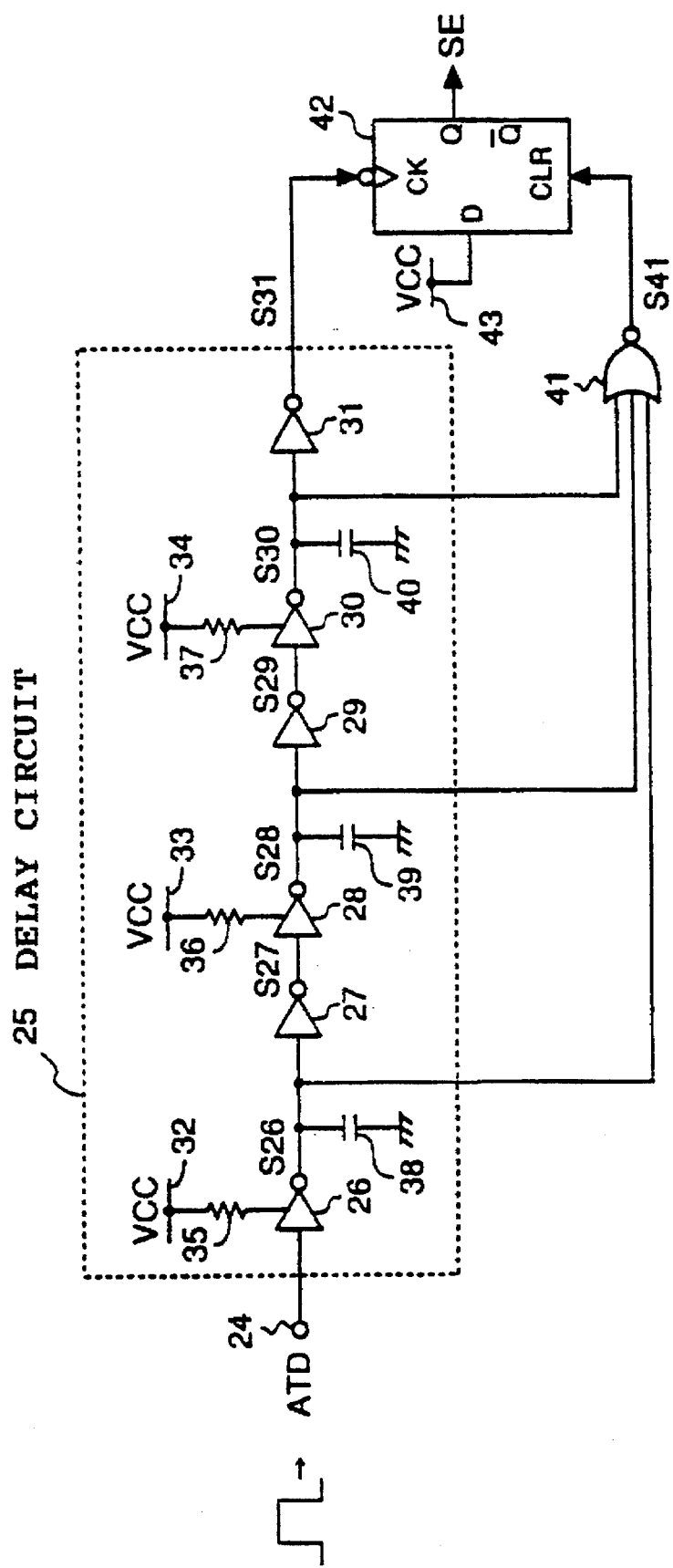
FIG. 5 shows a schematic diagram of a first embodiment of the pulse-width-extension circuit according to the present invention.

FIG. 5 shows a schematic diagram of the first embodiment of the pulse-width-extension circuit according to the present invention. The pulse-width-extension circuit comprises a delay circuit 25 delaying the ATD signal, a NOR circuit 41 detecting the pulse width of the ATD signal, and a negative-edge-type D-flip-flop circuit 42 producing the sense-amplifier activating signal SE.

The ATD signal from the ATD circuit is applied to an ATD-signal input port 24. In the delay circuit 25, the ATD signal is delayed such that a delay time of a trailing edge of the ATD signal is longer than that of a leading edge thereof.

The delay circuit 25 comprises serially connected inverters 26 to 31, input threshold voltages of the inverters 26, 28, 30 being respectively set to relatively low voltages, and input threshold voltages of inverters 27, 29, 31 being respectively set to relatively high voltages.

Power-source voltage VCC is supplied to power source lines 32, 33, 34. Power-source voltage input ports of the inverters 26, 28, 30 are respectively connected to the power-source lines 32, 33, 34 through resistances 35, 36, 37. Power-source voltage input ports of the inverters 27, 29, 31 are directly connected to a power-source line (not shown). Capacitors 38, 39, 40 are connected between each output of the inverters 26, 28, 30 and a ground.

A rise time of an output signal of the inverter 26 is set to a relatively long time by an RC delay circuit consisting of the resistance 35 and the capacitor 38. A rise time of an output signal of the inverter 28 is set to a relatively long time by an RC delay circuit consisting of the resistance 36 and the capacitor 39. A rise time of an output signal of the inverter 30 is set to a relatively long time by an RC delay circuit consisting of the resistance 37 and the capacitor 40.

The NOR circuit 41 is supplied with the output S26 of the inverter 26, the output S28 of the inverter 28, and the output S30 of the inverter 30. The NOR circuit 41 detects the pulse width of the ATD signal.

In the D-flip-flop circuit 42, a data input port D is connected to a power-source line 43, a clock input port CK is connected to an output of the inverter 31, and a clear port CLR is connected to an output port of the NOR circuit 41. And from a positive-phase output port Q, the ATD signal whose pulse width is extended is produced as the sense-amplifier activating signal SE.

Figure 6:
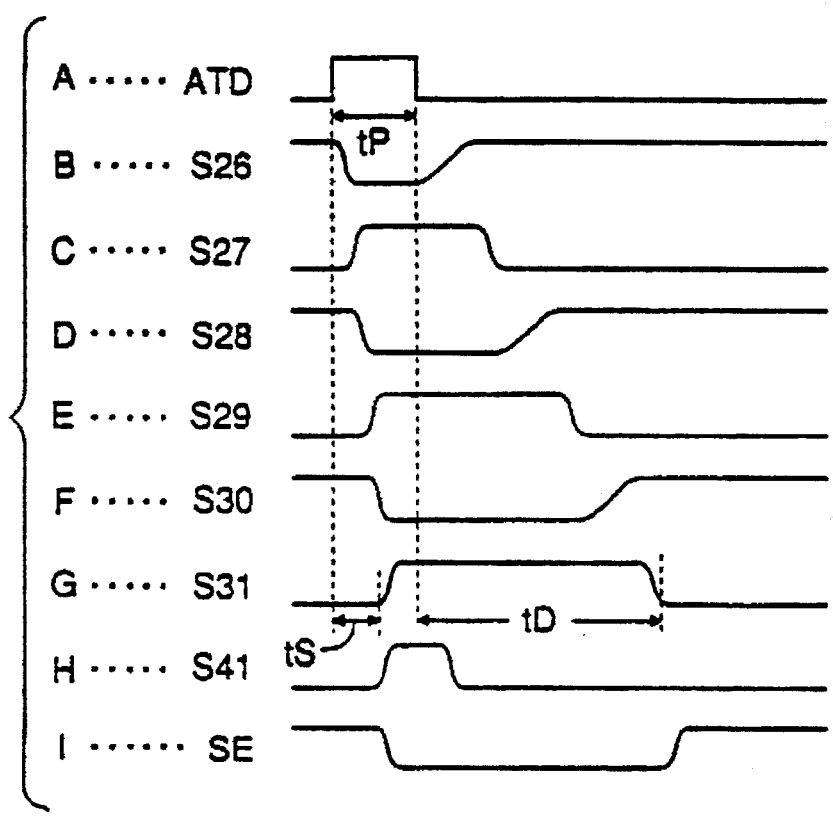
FIG. 6 shows a timing diagram indicating an operation of the first embodiment of the pulse-width-extension circuit according to the present invention shown in FIG. 5 in the case that the ATD signal having a normal pulse width is produced from the ATD circuit based on the transition of the address signal.

FIG. 6 shows a timing diagram indicating an operation of the first embodiment of the pulse-width-extension circuit according to the present invention shown in FIG. 5 in a case that the ATD signal having a normal pulse width is produced from the ATD circuit based on the transition of the address signal. FIG. 6-(A) indicates the ATD signal, FIG. 6-(B) indicates the output S26 of the inverter 26, FIG. 6-(C) indicates an output S27 of the inverter 27, FIG. 6-(D) indicates the output S28 of the inverter 28, FIG. 6-(E) indicates an output S29 of the inverter 29, FIG. 6-(F) indicates the output S30 of the inverter 30, FIG. 6-(G) indicates the output S31 of the inverter 31, FIG. 6-(H) indicates the output S41 of the NOR circuit 41, and FIG. 6-(I) indicates the sense-amplifier activating signal SE.

In the first embodiment shown in FIG. 5, when no ATD signal (pulse) is produced from the ATD circuit, a level of the ATD-signal input port 24 is kept at a low level (L level). In this situation, the output S26 of the inverter 26 is at a high level (H level), the output level S27 of the inverter 27 is at the L level, the output level S28 of the inverter 28 is at the H level, the output level S29 of the inverter 29 is at the L level, the output level S30 of the inverter 30 is at the H level, the output level S31 of the inverter 31 is at the L level, and the output S41 of the NOR circuit 41 is at the L level.

Therefore, during the above situation, the D-flip-flop circuit 42 keeps latching the power-source voltage VCC supplied to the data input port D, and produces the sense-amplifier activating signal SE at the H level (deactivation level).

Then, when the ATD signal is produced from the ATD circuit (a level of the ATD signal rises up), the level of the ATD-signal input port 24 becomes the H level. In this situation, the output S26 of the inverter 26 becomes the L level, the output level S27 of the inverter 27 becomes the H level, the output level S28 of the inverter 28 becomes the L level, the output level S29 of the inverter 29 becomes the H level, the output level S30 of the inverter 30 becomes the L level, and the output level S31 of the inverter 31 becomes the H level.

As mentioned before, since the input threshold voltages of the inverters 26, 28, 30 are respectively set to the relatively low voltages, and the input threshold voltages of the inverters 27, 29, 31 are respectively set to the relatively high voltages, a transition from the L level to the H level in a leading edge of the output S31 of the inverter 31 is carried out a relatively short time after the ATD signal rises up.

In this situation, when the output S30 of the inverter 30 goes from the H level to the L level, the outputs S26, S28 of the inverters 26, 28 are the L levels. Therefore, the output S41 of the NOR circuit 41 goes from the L level to the H level.

To ensure the above operation (namely, when the output S30 of the inverter 30 is transited from the H level to the L level, the outputs S26, S28 of the inverters 26, 28 are at the L levels), delay times of the inverters 26 to 30 are adjusted.

When the output S41 of the NOR circuit 41 goes from the L level to the H level, the D-flip-flop circuit 42 is cleared, and the sense-amplifier activating signal SE goes from the H level (deactivation level) to the L level (activation level).

Then, when the level of the ATD signal falls, the level of the ATD-signal input port 24 becomes the L level. In this situation, the output S26 of the inverter 26 becomes the H level, the output level S27 of the inverter 27 becomes the L level, the output level S28 of the inverter 28 becomes the H level, the output level S29 of the inverter 29 becomes the L level, the output level S30 of the inverter 30 becomes the H level, and the output level S31 of the inverter 31 becomes the L level.

As a result, in the D-flip-flop circuit 42, the clock input port CK goes from the H level to the L level. Therefore, the power-source voltage is latched and the sense-amplifier activating signal SE returns to the H level (deactivation signal).

Since the rise times of the output signals of the inverters 26, 28, 30 are respectively set to the relatively long time, and the input threshold voltages of the inverters 27, 29, 31 are respectively set to the relatively high voltages, a transition from the H level to the L level in a trailing edge of the output S31 of the inverter 31 is carried out a relatively long time after the level of the ATD signal falls.

In this way, in the first embodiment of the pulse-width-extension circuit shown in FIG. 5, when the ATD signal having the normal pulse width is produced from the ATD circuit, the ATD signal whose pulse width is extended can be produced as the sense-amplifier activating signal SE.

In FIG. 6, when the pulse width of the ATD signal is tP, a period from a rising edge of the ATD signal to a rising edge of the output S31 of the inverter 31, namely a delay time of the front edge of the ATD signal in the delay circuit 25, is tS, a period from a falling edge of the ATD signal to a falling edge of the output S31 of the inverter 31, namely a delay time of the trailing edge of the ATD signal in the delay circuit 25, is tD, and a pulse width of the sense-amplifier activating signal SE is represented by:

$$tD+tP-tS.$$

Figure 7:
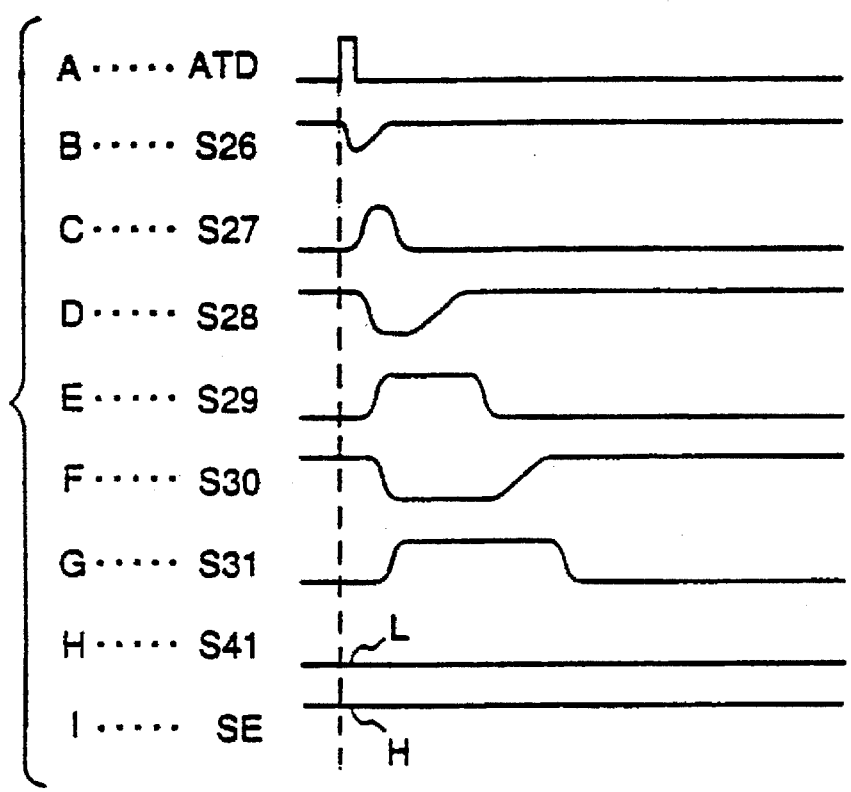
FIG. 7 shows a timing diagram indicating an operation of the first embodiment of the pulse-width-extension circuit according to the present invention shown in FIG. 5 in the case that the abnormal ATD signal which has the short pulse width due to the noise, etc., is produced from the ATD circuit.

FIG. 7 shows a timing diagram indicating an operation of the first embodiment of the pulse-width-extension circuit according to the present invention shown in FIG. 5 where the abnormal ATD signal which has the short pulse width due to the noise, etc., is produced from the ATD circuit. FIG. 7-(A) indicates the ATD signal, FIG. 7-(B) indicates the output S26 of the inverter 26, FIG. 7-(C) indicates the output S27 of the inverter 27, FIG. 7-(D) indicates the output S28 of the inverter 28, FIG. 7-(E) indicates the output S29 of the inverter 29, FIG. 7-(F) indicates the output S30 of the inverter 30, FIG. 7-(G) indicates the output S31 of the inverter 31, FIG. 7-(H) indicates the output S41 of the NOR circuit 41, and FIG. 7-(I) indicates the sense-amplifier activating signal SE.

In the first embodiment shown in FIG. 5, when no ATD signal (pulse) is produced from the ATD circuit, the level of the ATD-signal input port 24 is kept at the L level. In this situation, the output S26 of the inverter 26 is at the H level, the output level S27 of the inverter 27 is at the L level, the output level S28 of the inverter 28 is at the H level, the output level S29 of the inverter 29 is at the L level, the output level S30 of the inverter 30 is at the H level, the output level S31 of the inverter 31 is at the L level, and the output S41 of the NOR circuit 41 is at the L level.

Therefore, during the above situation, the D-flip-flop circuit 42 keeps latching the power-source voltage VCC supplied to the data input port D, and produces the sense-amplifier activating signal SE at the H level (deactivation level).

Then, when the ATD signal having the abnormal short pulse width based on the noise is produced from the ATD circuit (the level of the ATD signal rises), the level of the ATD-signal input port 24 becomes the H level. In this situation, the output S26 of the inverter 26 becomes the L level, the output level S27 of the inverter 27 becomes the H level, the output level S28 of the inverter 28 becomes the L level, the output level S29 of the inverter 29 becomes the H level, the output level S30 of the inverter 30 becomes the L level, and the output level S31 of the inverter 31 becomes the H level.

As mentioned above, since the input threshold voltages of the inverters 26, 28, 30 are respectively set to the relatively low voltages, and the input threshold voltages of the inverters 27, 29, 31 are respectively set to the relatively high voltages, a transition from the L level to the H level in a leading edge of the output S31 of the inverter 31 is carried out a relatively short time after the ATD signal rises up.

Then, the level of the ATD-signal input port 24 immediately becomes the L level. In this situation, the output S26 of the inverter 26 becomes the H level, the output level S27 of the inverter 27 becomes the L level, the output level S28 of the inverter 28 becomes the H level, the output level S29 of the inverter 29 becomes the L level, the output level S30 of the inverter 30 becomes the H level, and the output level S31 of the inverter 31 becomes the L level.

In the above situation, since the pulse width of the ATD signal is short, a trailing edge of the output S26 of the inverter 26 also immediately rises. Therefore, when the output S30 of the inverter 30 goes to the L level, the output S26 of the inverter 26 is at the H level. Thus, the output S41 of the NOR circuit 41 stays at the L level without going to the H level shown in FIG. 7H. As a result, in this situation, the D-flip-flop circuit 42 is not cleared, and thus, the sense-amplifier activating signal SE is maintained at the H level (deactivation level).

In the above first embodiment, the delay times of the inverters 26, 28, 30 are determined so as to satisfy the above operation where the pulse width of the ATD signal is shorter than a given width. The given width is determined by the undesired pulse such as noise.

Furthermore, if a time necessary for the NOR circuit 41 and the D-flip-flop circuit 42 to react is represented by "$\alpha$", when the pulse width of the ATD signal is shorter than "tS+$\alpha$", the output S41 of the NOR circuit 41 is maintained at the L level. This occurs because, in the above situation, when the output S30 of the inverter 30 goes to the L level, the output S26 of the inverter 26 is at the H level.

In this way, according to the first embodiment, even if the abnormal ATD signal which has the short pulse width due to the noise, etc., is produced from the ATD circuit, the sense-amplifier activating signal SE going to the L level is not produced. Therefore, the activating signal not having a pulse width of sufficient length to exactly activate the sense amplifier is not transmitted to the sense amplifier, so that the fault operation of the sense amplifier may be prevented.

2. SECOND EMBODIMENT

Figure 8:
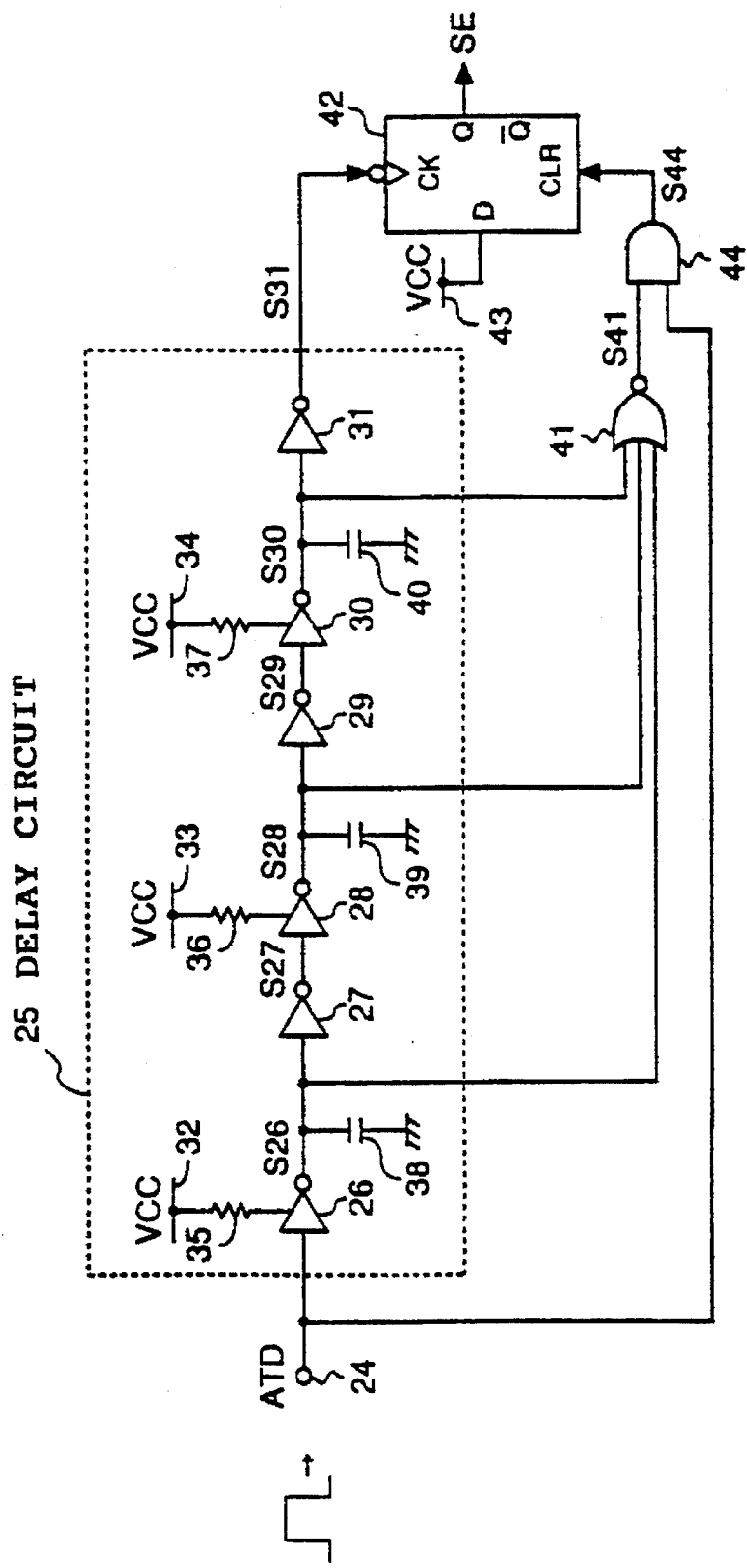
FIG. 8 shows a schematic diagram of a second embodiment of the pulse-width-extension circuit according to the present invention.

FIG. 8 shows a schematic diagram of the second embodiment of the pulse-width-extension circuit according to the present invention. Having the same configuration as that shown in FIG. 5, the pulse-width-extension circuit comprises the delay circuit 25 delaying the ATD signal, the NOR circuit 41 detecting the pulse width of the ATD signal, and the negative-edge-type D-flip-flop circuit 42 producing the sense-amplifier activating signal SE. The pulse-width-extension circuit shown in FIG. 8 further comprises an AND circuit 44 which AND-processes the output S41 of the NOR circuit 41 and the ATD signal and produces its AND-processed result as an output signal S44 to the clear port CLR of the D-flip-flop circuit 42.

In the first embodiment, in the case where the abnormal ATD signal which has the short pulse width due to the noise, etc., is produced from the ATD circuit, if the rise time of the inverter 26 is longer than a desired value, when the output S30 of the inverter 30 goes to the L level, the output S26 of the inverter 26 is at the L level under the input threshold voltage of the NOR circuit. Therefore, the output S41 of the inverter 41 is inverted to the H level. Thereby, the D-flip-flop circuit 42 is cleared, and the sense-amplifier activating signal SE at the L level (activation level) may be produced.

On the other hand, in the second embodiment, when the ATD signal falls from the H level to the L level, the AND circuit 44 is deactivated to produce a L level as the output S44. Therefore, in the case where the rise time of the inverter 26 is longer than the designed value, even if the output S41 of the NOR circuit 41 produces the H level, the D-flip-flop circuit 42 is not cleared, and thus, the sense-amplifier activating signal SE is maintained at the H level (deactivation level).

According to the second embodiment, the fault operation of the sense amplifier due to the abnormal ATD signal which has the short pulse width may be surely prevented as compared to the first embodiment.

3. THIRD EMBODIMENT

Figure 9:
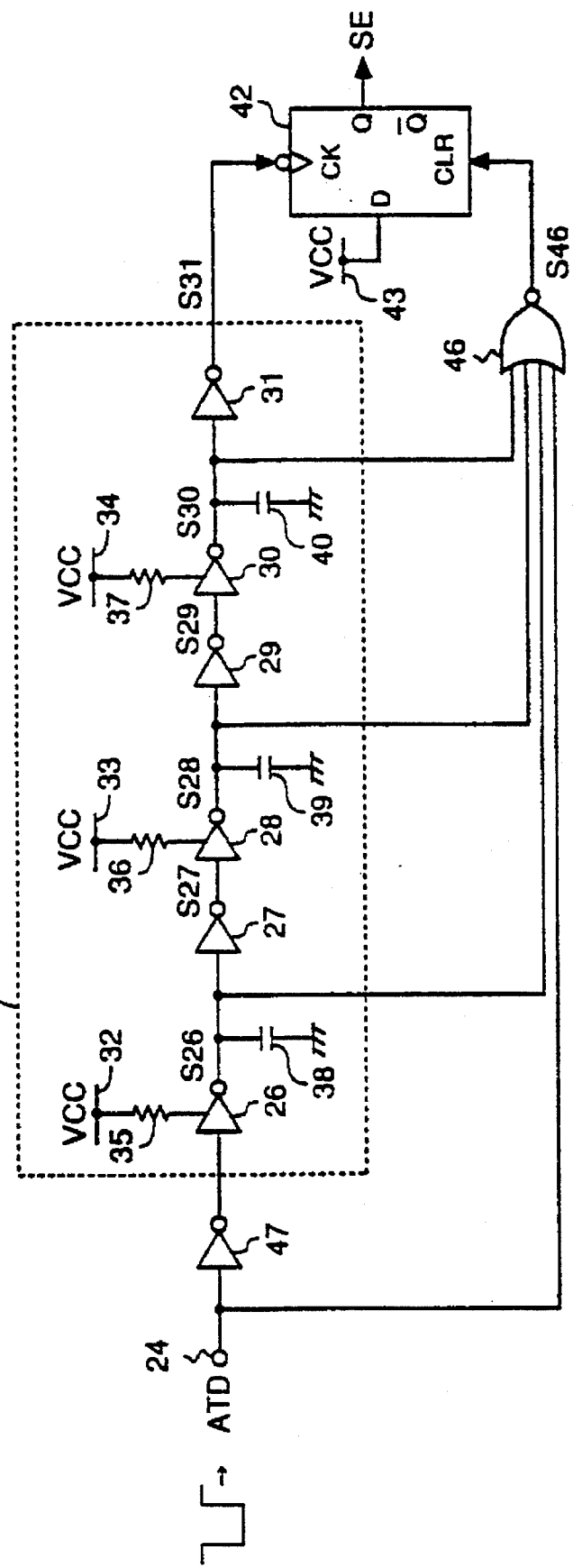
FIG. 9 shows a schematic diagram of a third embodiment of the pulse-width-extension circuit according to the present invention.

FIG. 9 shows a schematic diagram of the third embodiment of the pulse-width-extension circuit according to the present invention. The third embodiment of the pulse-width-extension circuit has the same configuration as that of the first embodiment shown in FIG. 5, except for comprising a 4-port-NOR circuit 46 instead of the 3-port-NOR circuit 41. The pulse-width-extension circuit shown in FIG. 9 further comprises an inverter 47 between the ATD-signal input port 24 and the inverter 26. An inverted signal of the ATD signal is supplied to the ATD-signal input port 24.

The NOR circuit 46 is supplied with the ATD signal, the output S26 of the inverter 26, the output S28 of the inverter 28, and the output S30 of the inverter 30. By the inverter 47, the inverted signal of the ATD signal is inverted, and is supplied to the inverter 26 of the delay circuit 25. Therefore, an operation of the delay circuit 25 in the third embodiment is the same as that of the delay circuit in the second embodiment shown in FIG. 8. A function of the NOR circuit 46 is the same as that of the NOR circuit 41 and the AND circuit 44 in the second embodiment. Thus, a total operation of the third embodiment is the same as that of the second embodiment.

Therefore, according to the third embodiment, in the same way as that of the second embodiment, the fault operation of the sense amplifier due to the abnormal ATD signal which has the short pulse width may be surely prevented as compared to the first embodiment.

Figure 10:
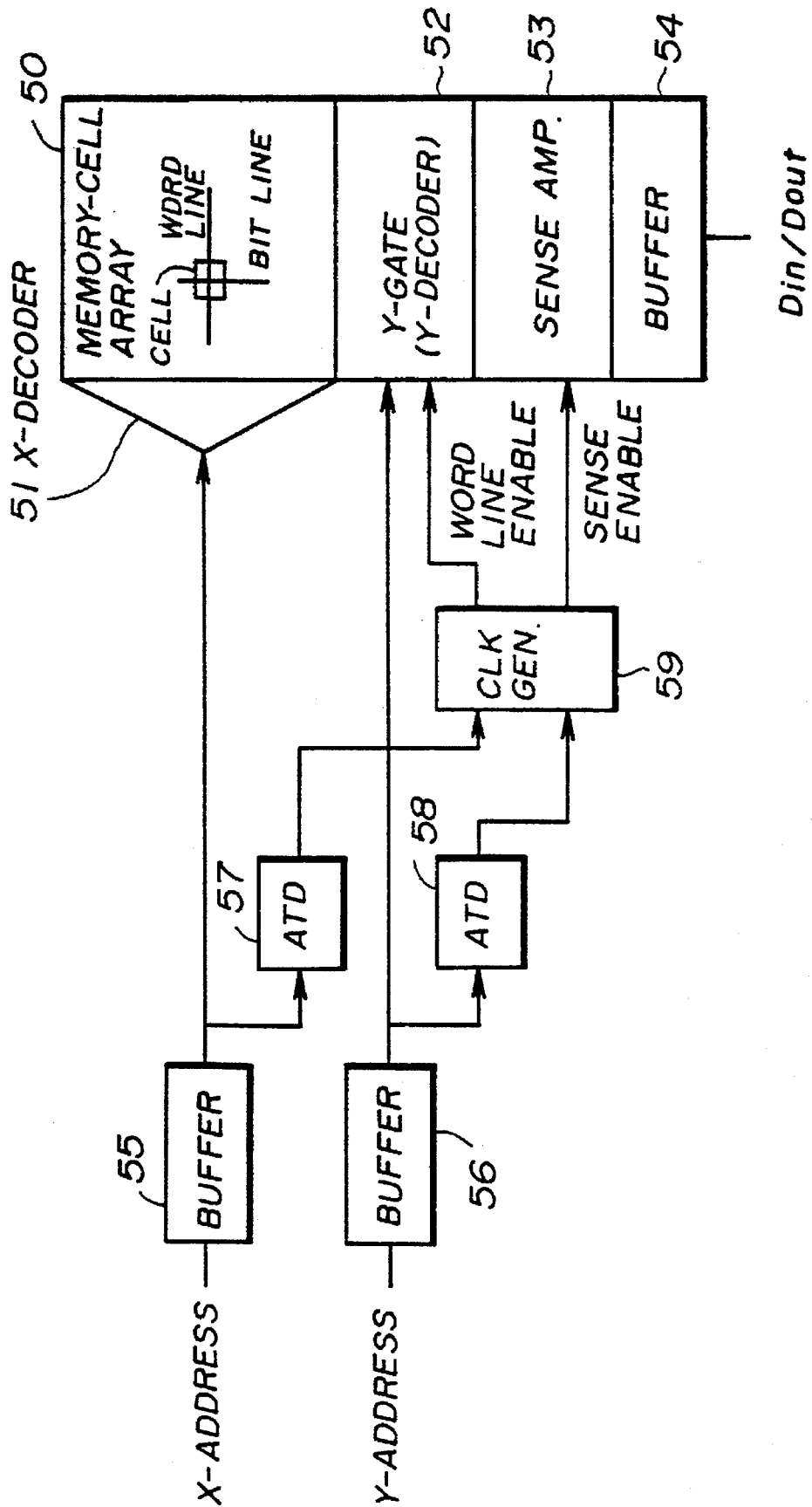
FIG. 10 shows a block diagram of a configuration of a conventional SRAM.
Figure 11:
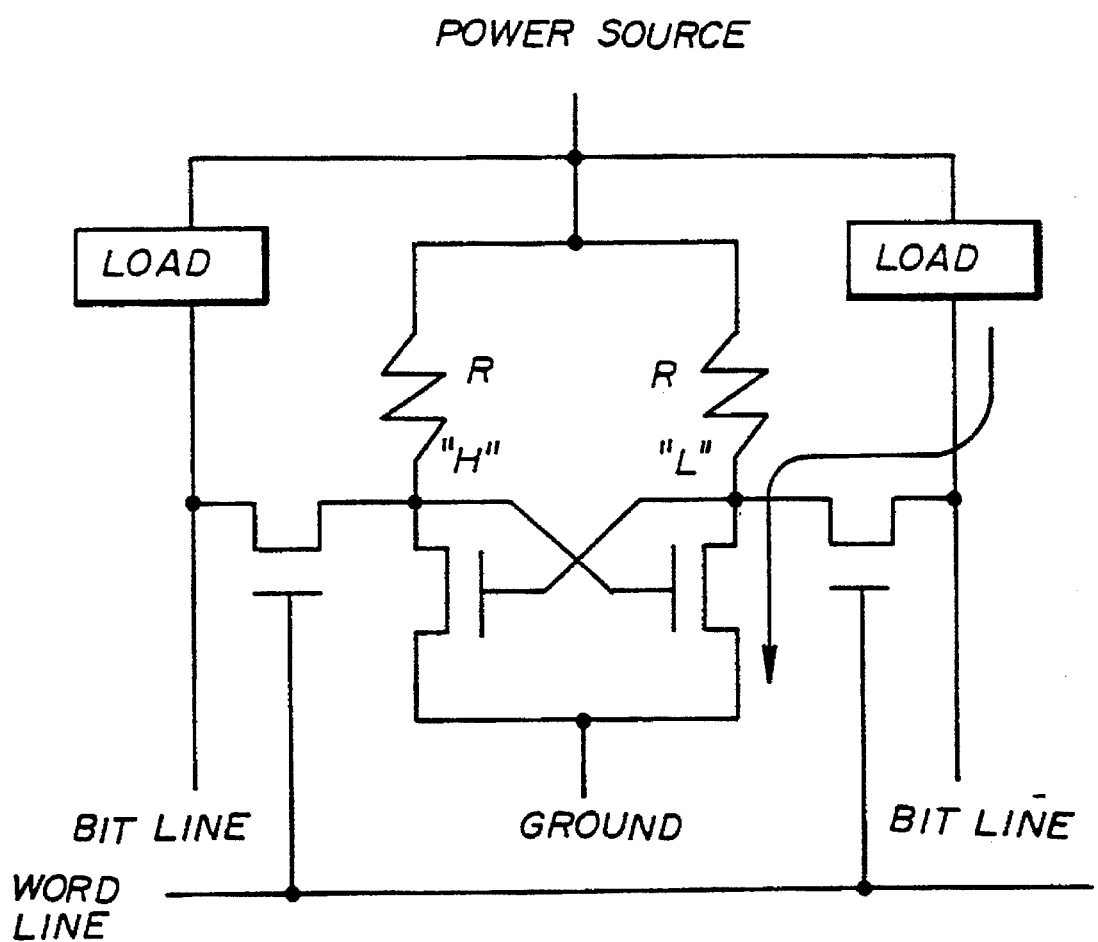
FIG. 11 shows a schematic diagram of a memory cell in a memory-cell array of the SRAM.
Figure 12:
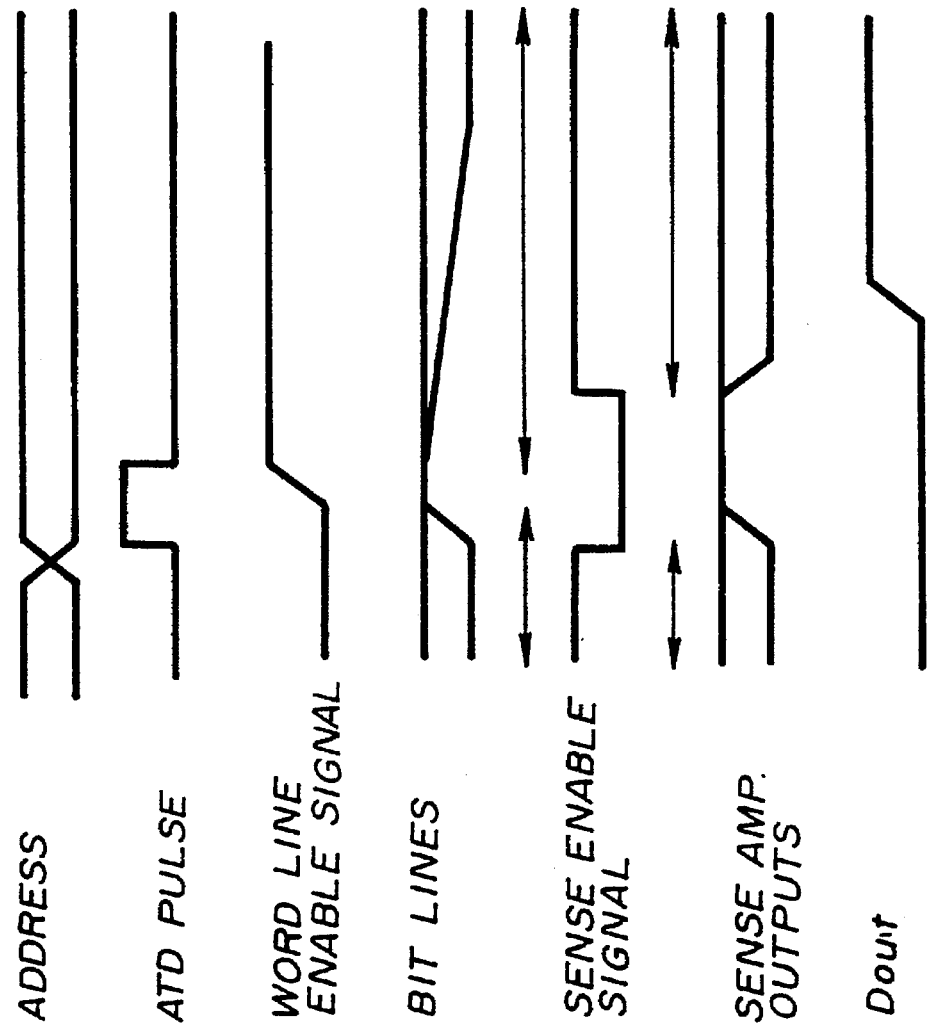
FIG. 12 is a timing diagram of signals in the conventional SRAM shown in FIG. 10.
Figure 13:
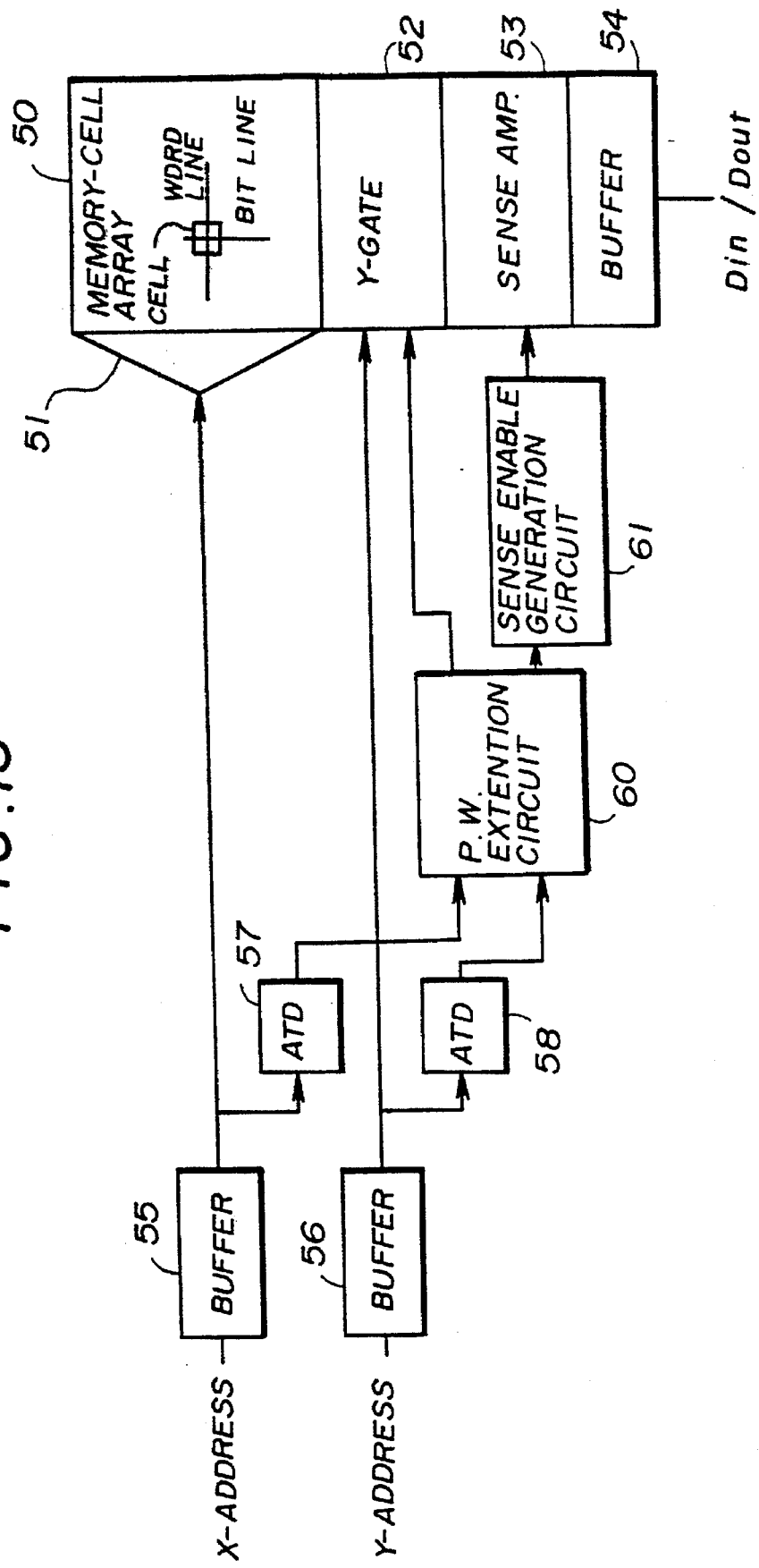
FIG. 13 shows a block diagram of a configuration of an SRAM to which the pulse-width-extension circuit according to the present invention is applied.

Next, a description will be given of an application of the pulse-width-extension circuit according to the present invention to electronic devices, by referring to FIGS. 10 to 14. FIG. 10 shows a block diagram of a configuration of a conventional SRAM. FIG. 11 shows a schematic diagram of a memory cell in a memory-cell array of the SRAM. FIG. 12 shows timing diagrams of signals in the conventional SRAM shown in FIG. 10. FIG. 13 shows a block diagram of a configuration of an SRAM to which the pulse-width-extension circuit according to the present invention is applied. FIG. 14 shows timing diagrams of signals in the SRAM shown in FIG. 13.

In the conventional SRAM shown in FIG. 10, X-addresses and Y-addresses are applied to a memory-cell array 50 respectively through an X-decoder 51 and a Y-gate 52 including a Y-decoder. Data stored in the memory cell is output through the Y-gate 52, a sense amplifier 53, and a buffer 54. An ATD circuit 57 produces an ATD pulse for the X-address to a CLK generator 59, and an ATD circuit 58 produces an ATD pulse for the Y-address to the CLK generator 59. The CLK generator 59 produces, for example, a word line enable signal and a sense enable signal shown in FIG. 12.

In FIG. 11, the memory cell is constructed with transistors controlled by complementary bit lines and a word line. As shown in FIG. 11, when a word line is selectively enabled by the word line enable signal in the memory cell selected by the bit lines, a DC current flows as shown by an arrow. When the word line enable signal remains at the high level for a long time as shown by an arrow of FIG. 12, the DC current goes on flowing.

When the sense enable signal remains at the high level for a long time as shown in FIG. 12, the sense amplifier 53 goes on operating for a long time as shown by an arrow.

The above-described cell memory operation and sense amplifier operation lead the SRAM to a high power consumption.

On the other hand, the SRAM according to the present invention shown in FIG. 13 includes a pulse-width-extension circuit 60. The pulse-width-extension circuit 60 may be applied with one of the above-mentioned embodiments according to the present invention. The ATD pulses from the ATD circuits 57, 58 are extended in the pulse-width-extension circuit 60 as shown in FIG. 14.

The extended pulse shown in FIG. 14 may be the word line enable signal mentioned above. When the word line shown in FIG. 11 is enabled by such an extended pulse having a given pulse width, the DC current flows only during the given pulse width as shown in an arrow under a bit line signal of FIG. 14.

Further, a sense enable signal shown in FIG. 14 is produced in a sense-enable generation circuit 61 based on the extended pulse. Since the sense enable signal has a given pulse width, the sense amplifier 53 operates only during the given pulse width of the sense enable signal as shown in an arrow under a sense amplifier output signal.

These memory cell and sense amplifier operations according to the pulse-width-extension circuit make it possible to significantly reduce the power consumption of the SRAM.

Furthermore, in the pulse-width-extension circuit, when the pulse width of the ATD pulse is shorter than the predetermined width, the extended pulse is not produced. Therefore, this prevents the word line and the sense amplifier from operating in a fault manner.

As described above, the present invention has the following features.

When the pulse width of the input pulse signal is shorter than the given width, the output pulse signal whose pulse width is insufficiently extended is not produced to the following circuit. Therefore, the fault operation of the following circuit may be prevented.

The present invention may be applied to, for example, the pulse-width-extension circuit in the SRAM. The circuit extends the pulse width of the ATD signal and produces it as the sense-amplifier activating signal. In the pulse-width-extension circuit according to the present invention, even if the abnormal ATD signal which has the short pulse width due to the noise, etc., is produced from the ATD circuit, the fault operation of the sense amplifier due to the abnormal ATD signal may be prevented.

Further, the present invention is not limited to these embodiments, but various variations and modifications may be made without departing from the scope of the present invention.

What is claimed is:

1. A pulse-width-extension circuit comprising:

first means for producing an extended pulse signal having a pulse width greater than that of an input pulse;

second means for detecting whether the pulse width of said input pulse signal is equal to or greater than a predetermined pulse width; and third means for outputting said extended pulse signal as an output pulse signal when the pulse width of said input pulse signal is greater than the predetermined pulse width, and for preventing the output of said extended pulse signal as said output pulse when the pulse width of said input pulse signal is less than the predetermined pulse width.

2. The pulse-width-extension circuit as claimed in claim 1, wherein said first means comprises a delay circuit for delaying the input pulse signal such that a delay time of a trailing edge of the input pulse signal is greater than that of a leading edge thereof, wherein said second means comprises a pulse-width detection circuit receiving at least one output from said delay circuit for detecting the pulse width of said input pulse signal, and producing a pulse-width detection signal when the pulse width of the input pulse signal is equal to or greater than the predetermined pulse width, and wherein said third means comprises an output-pulse-signal generation circuit, when said pulse-width detection signal is supplied from said pulse-width detection circuit, for producing an output pulse signal corresponding to the delayed input pulse signal input from the delay circuit, and when no pulse-width detection signal is supplied, preventing output of said output pulse signal.

3. The pulse-width-extension circuit as claimed in claim 2, wherein said output-pulse-signal generation circuit produces an inverted output level in response to the trailing edge of said delay input pulse signal from the delay circuit, when said pulse-width detection signal is supplied.

4. The pulse-width-extension circuit as claimed in claim 3, wherein said delay circuit comprises:

a plurality of first inverters, each of the first inverters having a first threshold voltage; and a plurality of second inverters, each of the second inverters having a second threshold voltage higher than said first threshold voltage;

wherein said first inverters and second inverters are each alternately connected in series.

5. The pulse-width-extension circuit as claimed in claim 3, wherein said pulse-width detection circuit receives a plurality of output signals from said delay circuit for detecting the pulse width of said input pulse signal by logically processing levels of said plurality of output signals.

6. The pulse-width-extension circuit as claimed in claim 3, wherein said output-pulse-signal generation circuit comprises a flip-flop circuit.

7. The pulse-width-extension circuit as claimed in claim 6, wherein said flip-flop circuit has a clear port, a clock input port, and an output port, the clear port being supplied with said pulse-width detection signal, the clock input port being supplied said delayed input pulse signal from said delay circuit, and the output port producing said output pulse signal.

8. The pulse-width-extension circuit as claimed in claim 3, wherein said pulse-width detection circuit further comprises means for interrupting supply of said pulse-width detection signal to said output-pulse-generation circuit when said trailing edge of the input pulse signal is applied to said delay circuit.

9. The pulse-width-extension circuit as claimed in claim 3, wherein said input pulse signal is an address-transition detection signal produced from an address-transition detection circuit detecting a transition of an address signal, and said output pulse signal is a sense-amplifier activating signal activating a sense amplifier which amplifies data read out from a memory cell.

10. An electronic device comprising:

a pulse-width-extension circuit for producing an output pulse signal whose pulse width is extended as compared with a pulse width of an input pulse signal when the pulse width of the input pulse width is equal to or greater than a given width, and for producing no output pulse signal when the pulse width of the input pulse signal is less than the given width;

a first circuit for producing said input pulse signal to said pulse-width-extension circuit; and a second circuit for receiving said output pulse signal from said pulse-width-extension circuit.

11. The electronic device as claimed in claim 10, wherein said pulse-width-extension circuit comprises:

a delay circuit for delaying said input pulse signal such that a delay time of a trailing edge of the input pulse signal is greater than that of a leading edge thereof;

a pulse-width detection circuit for receiving at least one output from said delay circuit for detecting the pulse width of said input pulse signal, and producing a pulse-width detection signal when the pulse width of the input pulse signal is equal to or greater than the given width; and an output-pulse-signal generation circuit, when said pulse-width detection signal is supplied from said pulse-width detection circuit, for producing said output pulse signal corresponding to the delayed input pulse signal input from the delay circuit, and when no pulse-width detection signal is supplied, maintaining the same output level.

12. The electronic device as claimed in claim 11, wherein said output-pulse-signal generation circuit produces an inverted output level in response to the trailing edge of said delayed input pulse signal from the delay circuit, when said pulse-width detection signal is supplied.

13. The electronic device as claimed in claim 11, wherein said electronic device comprises a memory, said first circuit is an address-transition detection circuit for detecting a transition of an address signal of the memory and producing an address-transition detection signal as said input pulse signal of the pulse-width-extension circuit, and said second circuit is a sense amplifier which is activated by the output pulse signal from the pulse-width-extension circuit to amplify data from the memory; and wherein said sense amplifier is not activated when the pulse width of the address-transition detection signal is shorter than said given width.

* * * * *